United States Patent
Kim et al.

(10) Patent No.: US 10,367,163 B2
(45) Date of Patent: *Jul. 30, 2019

(54) ORGANIC LIGHT EMITTING DIODE AND ORGANIC LIGHT EMITTING DISPLAY DEVICE INCLUDING THE SAME

(71) Applicant: SAMSUNG DISPLAY CO., LTD., Yongin, Gyeonggi-Do (KR)

(72) Inventors: Dong Chan Kim, Hwaseong-si (KR); Won Jong Kim, Suwon-si (KR); Eung Do Kim, Seoul (KR); Dong Kyu Seo, Suwon-si (KR); Da Hea Im, Incheon (KR); Sang Hoon Yim, Suwon-si (KR); Chang Woong Chu, Hwaseong-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 197 days.

This patent is subject to a terminal disclaimer.

(21) Appl. No.: 14/736,663

(22) Filed: Jun. 11, 2015

(65) Prior Publication Data

US 2016/0056387 A1     Feb. 25, 2016

(30) Foreign Application Priority Data

Aug. 21, 2014 (KR) .................. 10-2014-0109198

(51) Int. Cl.
  *H01L 51/50* (2006.01)
  *H01L 51/00* (2006.01)
  *H01L 51/52* (2006.01)

(52) U.S. Cl.
  CPC ...... *H01L 51/5088* (2013.01); *H01L 51/0059* (2013.01); *H01L 51/0073* (2013.01); *H01L 51/0074* (2013.01); *H01L 51/5265* (2013.01)

(58) Field of Classification Search
  None
  See application file for complete search history.

(56) References Cited

U.S. PATENT DOCUMENTS

| | | | |
|---|---|---|---|
| 5,677,572 A | | 10/1997 | Hung et al. |
| 5,837,166 A | * | 11/1998 | Kawamura ............ C07C 211/54 252/583 |
| 8,513,658 B2 | * | 8/2013 | D'Andrade ......... H01L 51/5016 257/40 |
| 9,391,124 B2 | * | 7/2016 | Oh, II ................ H01L 51/5092 |

(Continued)

FOREIGN PATENT DOCUMENTS

| | | |
|---|---|---|
| CN | 102655164 A | 9/2012 |
| CN | 103050641 A | 4/2013 |

(Continued)

OTHER PUBLICATIONS

Abstract of WO 2014/021642 A1 (pub. 2014).*

(Continued)

*Primary Examiner* — Kevin M Bernatz
(74) *Attorney, Agent, or Firm* — Lee & Morse, P.C.

(57) ABSTRACT

An organic light emitting diode, including a first electrode and a second electrode facing each other; an emission layer between the first electrode and the second electrode; and a hole injection layer between the first electrode and the emission layer, the hole injection layer including a dipole material including a first component and a second component that have different polarities.

33 Claims, 9 Drawing Sheets

(56) References Cited

U.S. PATENT DOCUMENTS

| | | | | |
|---|---|---|---|---|
| 9,660,214 B2* | 5/2017 | Kim | ............... | H01L 51/5092 |
| 9,711,579 B2* | 7/2017 | Oh, II | ............... | H01L 51/5092 |
| 9,960,380 B2* | 5/2018 | Kim | ............... | H01L 51/5092 |
| 2009/0212688 A1* | 8/2009 | Song | ............... | H01L 51/508 |
| | | | | 313/504 |
| 2010/0148158 A1* | 6/2010 | Kim | ............... | C07C 2/86 |
| | | | | 257/40 |
| 2011/0240984 A1* | 10/2011 | Adamovich | ............... | H01L 51/002 |
| | | | | 257/40 |
| 2012/0223633 A1* | 9/2012 | Yoshinaga | ............... | H01L 27/3211 |
| | | | | 313/504 |
| 2013/0207096 A1* | 8/2013 | Kosuge | ............... | C07C 13/567 |
| | | | | 257/40 |
| 2014/0008643 A1* | 1/2014 | Lin | ............... | C07D 409/14 |
| | | | | 257/40 |
| 2014/0159023 A1* | 6/2014 | Matsumoto | ............... | H01L 51/0061 |
| | | | | 257/40 |
| 2015/0137110 A1* | 5/2015 | Ahn | ............... | H01L 51/5268 |
| | | | | 257/40 |
| 2015/0295199 A1* | 10/2015 | Yamamoto | ............... | H01L 51/5036 |
| | | | | 257/40 |
| 2016/0056387 A1* | 2/2016 | Kim | ............... | H01L 51/5088 |
| | | | | 257/40 |
| 2016/0056400 A1* | 2/2016 | Kim | ............... | H01L 51/504 |
| | | | | 257/40 |
| 2016/0056403 A1* | 2/2016 | Kim | ............... | H01L 51/5092 |
| | | | | 257/40 |
| 2016/0056404 A1* | 2/2016 | Kim | ............... | H01L 51/5092 |
| | | | | 257/40 |
| 2016/0099431 A1* | 4/2016 | Kim | ............... | H01L 51/5092 |
| | | | | 257/40 |
| 2016/0163994 A1* | 6/2016 | Park | ............... | C09K 11/06 |
| | | | | 257/40 |
| 2016/0211460 A1* | 7/2016 | Yoon | ............... | H01L 51/0061 |
| 2016/0329521 A1* | 11/2016 | Kim | ............... | H01L 51/5253 |
| 2016/0351819 A1* | 12/2016 | Kim | ............... | H01L 51/0061 |
| 2016/0365529 A1* | 12/2016 | Kim | ............... | H01L 51/5092 |
| 2016/0380235 A1* | 12/2016 | Kim | ............... | H01L 51/0061 |
| | | | | 257/40 |
| 2017/0331068 A1* | 11/2017 | Kim | ............... | H01L 51/5092 |
| 2018/0033977 A1* | 2/2018 | Thompson | ............... | C07F 1/08 |

FOREIGN PATENT DOCUMENTS

| | | | | |
|---|---|---|---|---|
| CN | 103811500 A | 5/2014 | | |
| EP | 0740489 A1 | 10/1996 | | |
| EP | 0740489 B1 | 1/2000 | | |
| KR | 10-2006-0078358 A | 7/2006 | | |
| KR | 10-2007-0020467 A | 2/2007 | | |
| KR | 10-2007-0071978 A | 7/2007 | | |
| KR | 10-2009-0072447 A | 7/2009 | | |
| KR | 10-2009-0092112 A | 8/2009 | | |
| KR | 10-0922755 B1 | 10/2009 | | |
| KR | 10-2011-0108720 A | 10/2011 | | |
| KR | 10-2013-0022986 A | 3/2013 | | |
| KR | 10-2014-0096438 A | 8/2014 | | |
| TW | 200727739 | 7/2007 | | |
| TW | 200917893 A | 4/2009 | | |
| TW | 200936545 A | 9/2009 | | |
| TW | 200943600 A | 10/2009 | | |
| TW | 201004010 A | 1/2010 | | |
| TW | 201133977 A | 10/2011 | | |
| TW | 201248963 A | 12/2012 | | |
| TW | 201426994 A | 7/2014 | | |
| WO | WO 2014021642 A1 * | 2/2014 | ......... | H01L 51/5268 |
| WO | WO 2014/104514 A1 | 7/2014 | | |

OTHER PUBLICATIONS

Lee et al. (Org. Elec., 9, 2008, 805).*
Applied Physics Letters 87, 212108 (2005); Wu, et al.
ACS Appl. Mater. Interfaces 2012, 4, 5211 5216; Gao, et al.

* cited by examiner

ORGANIC LIGHT EMITTING DIODE AND ORGANIC LIGHT EMITTING DISPLAY DEVICE INCLUDING THE SAME

CROSS-REFERENCE TO RELATED APPLICATION

Korean Patent Application No. 10-2014-0109198, filed on Aug. 21, 2014, in the Korean Intellectual Property Office, and entitled: "Organic Light Emitting Diode and Organic Light Emitting Display Device Including the Same," is incorporated by reference herein in its entirety.

BACKGROUND

1. Field

Provided are an organic light emitting diode and an organic light emitting display device including the same.

2. Description of the Related Art

A liquid crystal display (LCD) may be substituted for a cathode ray tube (CRT) to help reduce the weight and the thickness of monitors and televisions. A liquid crystal display, which is a passive light emitting device, needs a separate backlight, and may have limited response speed and viewing angle.

SUMMARY

Embodiments may be realized by providing an organic light emitting diode, including a first electrode and a second electrode facing each other; an emission layer between the first electrode and the second electrode; and a hole injection layer between the first electrode and the emission layer, the hole injection layer including a dipole material including a first component and a second component that have different polarities.

The first component may be a metal or non-metal having a work function of 4.0 eV or more, and the second component may include a halogen.

The first component may include one or more of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, In, or Zn.

The second component may include one or more of F, Cl, Br, or I.

The dipole material may include one or more of $NiI_2$, $CoI_2$, $CuI$, $AgI$, $SnI_2$, or $InI_3$.

The organic light emitting diode may further include an electron injection layer between the emission layer and the second electrode. The electron injection layer may have a work function of 3.0 eV or less and may include one or more of an alkali metal, an alkali earth metal, a rare earth element, or a transition metal, or an alloy thereof.

The electron injection layer may include one or more of Li, Na, K, Rb, Cs, Ca, Sr, Ba, Ce, Sm, Eu, Gd, Yb, or an alloy thereof.

A dipole moment of the dipole material may be 5 Debye or more.

The first component may include one or more of an alkali metal, an alkali earth metal, a rare earth element, or a transition metal, and the second component may include a halogen.

The first component may have a work function of 3.0 eV or less and may include one or more of Li, Na, K, Rb, Cs, Ca, Sr, Ba, Ce, Sm, Eu, Gd, Yb, or an alloy thereof.

The hole injection layer may further include a metal having a work function of 4.3 eV or more.

The metal having a work function of 4.3 eV or more may include one or more of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, or Zn.

The hole injection layer may further include an oxide having a relative dielectric constant of 10 or more.

The oxide may include one or more of $WO_3$, $MoO_3$, $Cu_2O$, $Yb_2O_3$, $Sm_2O_3$, $Nb_2O_3$, $Gd_2O_3$, or $Eu_2O_3$.

The organic light emitting diode may further include a hole transfer layer between the emission layer and the hole injection layer and an electron transfer layer between the emission layer and the second electrode. The hole transfer layer and the electron transfer layer may include an organic material.

The hole injection layer may further include at least one of metal having a work function of 4.3 eV or more and an oxide having a relative dielectric constant of 10 or more.

The hole injection layer may be composed of a plurality of layers, and each of the plurality of layers may include at least one of the dipole material, the metal having a work function of 4.3 eV or more, and the oxide having a relative dielectric constant of 10 or more.

Embodiments may be realized by providing an organic light emitting display device, including a substrate; a gate line on the substrate; a data line and a driving voltage line; a switching thin film transistor connected to the gate line and the data line; a driving thin film transistor connected to the switching thin film transistor and the driving voltage line; and an organic light emitting diode connected to the driving thin film transistor. The organic light emitting diode includes a first electrode and a second electrode facing each other; an emission layer between the first electrode and the second electrode; and a hole injection layer between the first electrode and the emission layer, the hole injection layer including a dipole material of a first component and a second component that have different polarities.

The first component may be a metal or non-metal having a work function of 4.0 eV or more, and the second component may include a halogen.

The first component may include one or more of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, In, or Zn.

The second component may include one or more of F, Cl, Br, or I.

The dipole material may include one or more of $NiI_2$, $CoI_2$, $CuI$, $AgI$, $SnI_2$ or $InI_3$.

A dipole moment of the dipole material may be 5 Debye or more.

The first component may include one or more of an alkali metal, an alkali earth metal, a rare earth element, or a transition metal, and the second component may include a halogen.

The first component may have a work function of 3.0 eV or less and may include one or more of Li, Na, K, Rb, Cs, Ca, Sr, Ba, Ce, Sm, Eu, Gd, Yb, or an alloy thereof.

The hole injection layer may further include a metal having a work function of 4.3 eV or more.

The metal having a work function of 4.3 eV or more may include one or more of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, or Zn.

The hole injection layer may further include an oxide having a relative dielectric constant of 10 or more.

The oxide may include one or more of $WO_3$, $MoO_3$, $Cu_2O$, $Yb_2O_3$, $Sm_2O_3$, $Nb_2O_3$, $Gd_2O_3$, or $Eu_2O_3$.

The emission layer may include a red emission layer, a green emission layer, and a blue emission layer, and may further include an auxiliary layer under the blue emission layer.

The organic light emitting element may further include a red resonance auxiliary layer disposed below the red light emission layer and a green resonance auxiliary layer disposed below the green light emission layer.

The auxiliary layer may include a compound expressed by the following Chemical formula 1:

Chemical formula 1

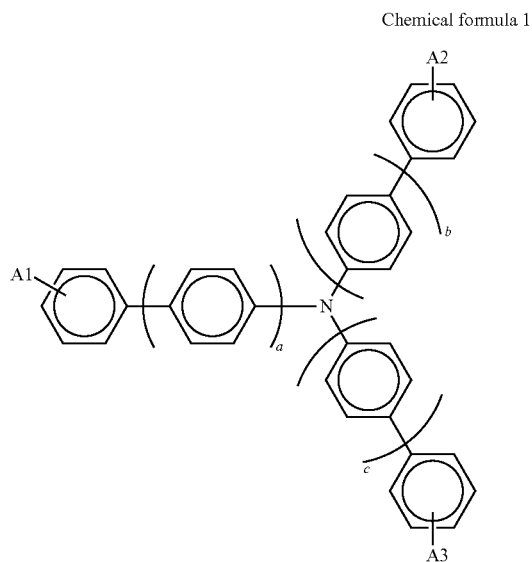

A1, A2, and A3 may each be an alkyl group, an aryl group, carbazole, dibenzothiophene, Dibenzofuran (DBF), and biphenyl, and a, b, and c may each be positive numbers between zero to four.

The auxiliary layer may include a compound expressed by the following Chemical formula 2:

Chemical formula 2

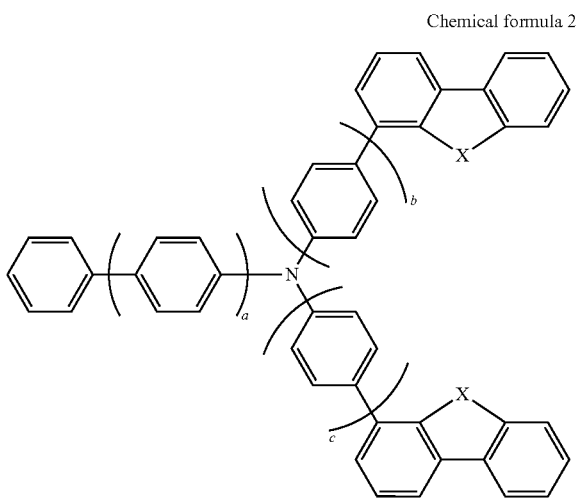

a may be 0 to 3, b and c may each be 0 to 3, X may be selected from O, N, and S, and each X may be the same or different.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
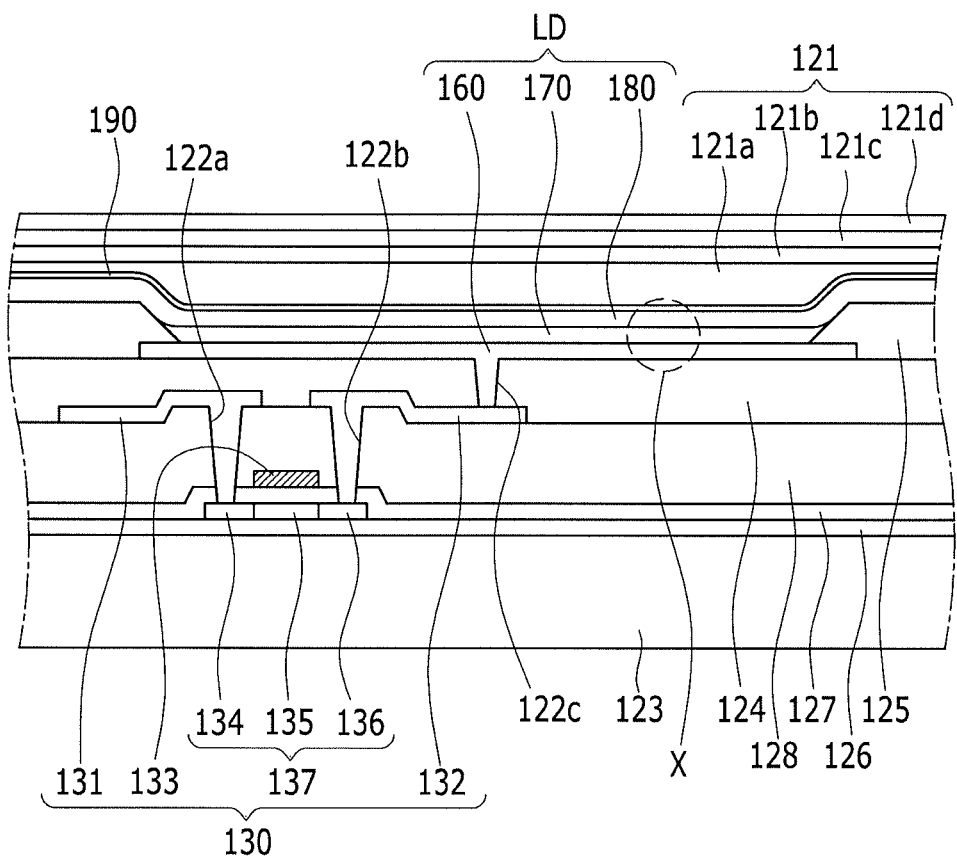
FIG. 1 illustrates a cross-sectional view of an organic light emitting display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, an organic light emitting display device, will be described as an example that is equipped with an organic light emitting diode according to an exemplary embodiment.

Figure 2:
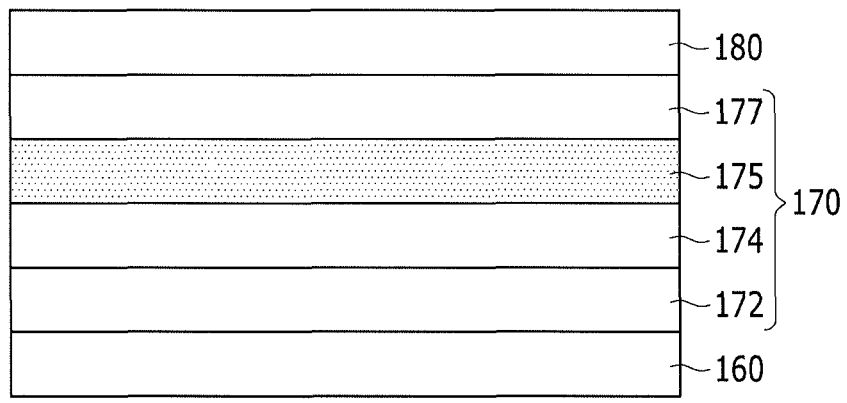
FIG. 2 illustrates a cross-sectional view enlarging the organic light emitting diode of FIG. 1.

FIG. 1 illustrates a cross-sectional view of an organic light emitting display device according to an exemplary embodiment. FIG. 2 illustrates a cross-sectional view enlarging a portion of the organic light emitting diode of FIG. 1.

Referring to FIGS. 1 and 2, an organic light emitting display device exemplary embodiment may include a substrate 123, a thin film transistor 130, a first electrode 160, a light emitting diode layer 170, and a second electrode 180. The first electrode 160 may be an anode and the second electrode 180 may be a cathode. In an embodiment, the first electrode 160 may be a cathode and the second electrode 180 may be an anode.

The substrate 123 may be made of an inorganic material such as glass, an organic material such as polycarbonate, polymethyl methacrylate, polyethylene terephthalate, polyethylene naphthalate, polyamide, or polyether sulfone, silicon wafer, or a combination thereof.

A substrate buffer layer 126 may be disposed on the substrate 123. The substrate buffer layer 126 may prevent infiltration of impurities and planarize a surface.

The substrate buffer layer 126 may be made of various materials capable of performing the function described above. For example, the substrate buffer layer 126 may include at least one of a silicon nitride (SiNx) film, a silicon oxide (SiOy) film, a silicon oxynitriding (SiOxNy) film. The substrate buffer layer 126 is not a necessary component and may not be provided in accordance with the type and the process conditions of the substrate 123.

A driving semiconductor layer 137 may be formed on the substrate buffer layer 126. The driving semiconductor layer 137 may be made of a material including polysilicon. Further, the driving semiconductor layer 137 may include a channel region 135 not doped with impurities (dopants), and a source region 134 and a drain region 136 formed by doping at both sides of the channel region 135. The doped ion materials are P-type impurities such as boron (B) and $B_2H_6$ may be usually used. The impurities depend on the type of the thin film transistor.

A gate insulating layer 127 made of silicon nitride (SiNx) or silicon oxide (SiOy) may be disposed on the driving semiconductor layer 137. A gate wire including a driving gate electrode 133 may be disposed on the gate insulating layer 127. The driving gate electrode 133 overlaps at least a portion of the driving semiconductor layer 137, for example, the channel region 135.

An interlayer insulating layer 128 covering the gate electrode 133 may be formed on the gate insulating layer 127. A first contact hole 122a and a second contact hole 122b that may expose the source region 134 and the drain region 136 of the driving semiconductor layer 137 may be formed in the gate insulating layer 127 and the interlayer insulating layer 128. The interlayer insulating layer 128, similar to the gate insulating layer 127, may be made of silicon nitride (SiNx) or silicon oxide (SiOy).

A data wire including a driving source electrode 131 and a driving drain electrode 132 may be disposed on the interlayer insulating layer 128. The driving source electrode 131 and the driving drain electrode 132 may be connected to the source region 134 and the drain region 136 of the driving semiconductor layer 137 through the first contact hole 122a and the second contact hole 122b formed in the interlayer insulating layer 128 and the gate insulating layer 127, respectively.

The driving thin film transistor 130 may be formed by the driving semiconductor layer 137, the driving gate electrode 133, the driving source electrode 131, and the driving drain electrode 132. The configuration of the driving thin film transistor 130 may be modified in various ways.

A planarizing layer 124 covering the data wire may be formed on the interlayer insulating layer 128. The planarizing layer 124 planarizes a surface by removing a step, and may increase emission efficiency of an organic light emitting diode to be formed thereon. A third contact hole 122c exposing a portion of the drain electrode 132 may be formed in planarizing layer 124.

The planarizing layer 124 may be made of, for example, any one or more of polyacrylates resin, epoxy resin, phenolic resin, polyamides resin, polyimides resin, unsaturated polyesters resin, poly-phenylenethers resin, poly-phenylenesulfides resin, and benzocyclobutene (BCB).

In an embodiment, any one of the planarizing layer 124 and the interlayer insulating layer 128 may not be provided.

The first electrode 160 of the organic light emitting diode, for example, a pixel electrode 160 may be disposed on the planarizing layer 124. For example, the organic light emitting display device may include a plurality of pixel electrodes 160 disposed in a plurality of pixels, respectively. The plurality of pixel electrodes 160 may be spaced from each other. The pixel electrode 160 may be connected to the drain electrode 132 through the third contact hole 122c of the planarizing layer 124.

A pixel defining layer 125 having an opening that exposes the pixel electrode 160 may be disposed on the planarizing layer 124. For example, a plurality of openings corresponding to the pixels, respectively, is formed between the pixel defining layers 125. An light emitting diode layer 170 may be disposed in each of the openings formed by the pixel defining layers 125, and pixel regions where the light emitting diode layer 170 is formed may be defined by the pixel defining layers 125.

The pixel electrode 160 may be disposed to correspond to the opening of the pixel defining layer 125. In an embodiment, the pixel electrode 160 may not be disposed to correspond only to the opening of the pixel defining layer 125, and a portion of the pixel electrode 160 may be disposed under the pixel defining layer 125 to overlap the pixel defining layer 125.

The pixel defining layer 125 may be made of polyacryl-based resin, polyimide-based resin, or a silicon-based inorganic material.

The light emitting diode layer 170 may be disposed on the pixel electrode 160. The structure of the light emitting diode layer 170 will be described in detail below.

The second electrode 180, for example, a common electrode 180 may be disposed on the light emitting diode layer 170, and an organic light emitting diode LD including the pixel electrode 160, the light emitting diode layer 170, and the common electrode 180 may be formed.

The pixel electrode 160 and the common electrode 180 may be made of a transparent conductive material or a semitransparent or reflective conductive material. The organic light emitting display device may be a top emission type, a bottom emission type, or a double-sided emission type, depending on the material of the pixel electrode 160 and common electrode 180.

An overcoat 190 covering and protecting the common electrode 180 may be formed by organic layer on the common electrode 180.

A thin film encapsulation layer 121 may be formed on the overcoat 190. The thin film encapsulation layer 121 seals and protects the organic light emitting diode LD and a driving circuit formed on the substrate 123 against the outside.

The thin film encapsulation layer 121 may include organic sealing layers 121a and 121c and inorganic sealing layers 121b and 121d that are alternately stacked. For example, the thin film encapsulation layer 121 may be formed by alternately stacking two organic sealing layers 121a and 121c and two inorganic sealing layers 121b and 121d in FIG. 1.

Hereinafter, the organic light emitting diode according to an exemplary embodiment will be described with reference to FIG. 2.

Referring to FIG. 2, the organic light emitting diode (the part X in FIG. 1) according to an exemplary embodiment has a structure in which the first electrode 160, a hole injection layer 172, a hole transfer layer 174, an emission layer 175, an electrode transfer layer 177, and the second electrode 180 are sequentially stacked.

The first electrode 160 may be an anode, and a material selected from materials having a high work function may be selected for easy hole injection. The first electrode 160 may be a transparent electrode or an opaque electrode. The first electrode 160 may be a transparent electrode, and the first electrode 160 may be made of a conductive oxide such as indium-tin oxide (ITO), indium-zinc oxide (IZO), tin oxide $SnO_2$, zinc oxide (ZnO), or combinations thereof, or metal such as aluminum, silver, and magnesium, with a small thickness. The first electrode 160 may be an opaque electrode, and the first electrode 160 may be made of metal such as aluminum, silver, and magnesium.

The first electrode 160 may be formed in a two or more-layer structure including different kinds of materials. For example, the first electrode 160 may be formed to have a structure in which indium-tin oxide (ITO)/silver (Ag)/indium-tin oxide (ITO) are sequentially stacked.

The first electrode 160 may be formed by sputtering or vacuum deposition.

The hole injection layer 172 on the first electrode 160 improves hole injection from the first electrode 160 to the hole transfer layer 174. In the present exemplary embodiment, the hole injection layer 172 may include a dipole material formed by bonding of a first component and a second component which have different polarities. The first component is an element that may become a cation when the dipole material is ionized, and the second component may be an element that may become an anion.

In the present exemplary embodiment, the first component may be metal or non-metal having a work function of 4.3 eV or more. The first component may include one or more of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, or Zn.

The second element may include a halogen. The second component may be F, Cl, Br, or I.

In the present exemplary embodiment, the dipole material may include one or more of, for example, $NiI_2$, $CoI_2$, $CuI$, $AgI$, $SnI_2$, or $InI_3$, and may be a compound of the first component and the second component.

In the organic light emitting diode according to an exemplary embodiment, the hole injection layer 172 having intensive dipole properties may be disposed on the interface of the first electrode 160 that is an inorganic material and the hole transfer layer 174 or the emission layer 175 which are an organic material layer.

The vacuum level of the organic material layer may shift and the hole injection barrier may decrease. The electric field may increase at the interface, and tunneling of a hole may be possible.

For example, a dipole material of metal or non-metal having a work function of 4.3 eV or more (high work function) and halogen may dissociate on the interface, and the carrier injection barrier including a hole may be decreased by the metal having a high work function. The metal having a high work function may oxidize and capture electrons on the interface, the electrons may separate, holes may be formed in the organic material layer, a p-doped interface region may be formed, and a hole injection layer may be formed.

Halogen ions dissociated from the dipole material may prevent In and Sn ions in ITO (Indium Tin Oxide) of the first electrode 160 from moving to the organic material layer, and it may be possible to prevent crystallization of the organic material layer, for example, due to the In and Sn ions. Pin-holes formed on the surface of ITO may be covered, and swelling, for example, due to bonding of Ag and S in the atmosphere, may be reduced.

The thickness of the hole injection layer 172 may be about 25 nm to about 35 nm. Preferably, the hole injection layer 172 may be about 30 nm thick.

The hole transfer layer 174 may be disposed on the hole injection layer 172. The hole transfer layer 174 may properly deliver holes from the hole injection layer 172. The hole transfer layer 174 may include an organic material. For example, the hole transfer layer 174 may include at least one of NPD (N, N-dinaphthyl-N,N'-diphenyl benzidine), TPD (N,N-bis-(3-methylphenyl)-N, N'-bis-(phenyl)-benzidine), s-TAD, and MTDATA (4,4',4"-Tris(N-3-methylphenyl-N-phenyl-amino)-triphenylamine).

The thickness of the hole transfer layer 174 may be about 15 nm to about 25 nm. Preferably, the hole transfer layer 174 may be about 20 nm thick.

In the present exemplary embodiment, the hole injection layer 172 and the hole transfer layer 174 are stacked. In an embodiment, the hole injection layer 172 and the hole transfer layer 174 may be formed in a single layer.

The emission layer 175 may be disposed on the hole transfer layer 174. The emission layer may include an emission material exhibiting a specific color. For example, the emission layer 175 may exhibit basic colors such as blue, green, or red, or combinations of these colors.

The thickness of the emission layer 175 may be substantially 10 nm to 50 nm. The emission layer 175 may include a host and a dopant. The emission layer 175 may include a material emitting red, green, blue, and white light and may be made of a phosphorescent or fluorescent material.

The emission layer 175 may emit red light, and may be made of, for example, a phosphorescent material including a host material, for example, CBP (carbazole biphenyl) or mCP (1,3-bis(carbazol-9-yl), and a dopant, for example, any one or more of PIQIr(acac) (bis(1-phenylisoquinoline)acetylacetonate iridium), PQIr(acac) (bis(1-phenylquinoline) acetylacetonate iridium), PQIr(tris(1-phenylquinoline) iridium) and PtOEP(octaethylporphyrin platinum), or may be made of a fluorescent material including PBD:Eu(DBM) 3(Phen) or Perylene.

The emission layer 175 may emit green light, and may be made of, for example, a phosphorescent material including a host material, for example, CBP or mCP, and a dopant material, for example, Ir(ppy)3(fac-tris(2-phenylpyridine) iridium), or it may be made of a fluorescent material including Alq3(tris(8-hydroxyquinolino)aluminum).

The emission layer 175 may emit blue light, and may be made of, for example, a phosphorescent material including a host material, for example, CBP or mCP, and a dopant material, for example, (4,6-F2ppy)2Irpic. The emission layer may be made of, for example, a fluorescent material including any one of spiro-DPVBi, spiro-6P, distyryl benzene (DSB), distyrylarylene (DSA), PFO-based polymer, and PPV-based polymer.

The electron transfer layer 177 may be disposed on the emission layer 175. The electron transfer layer 177 may deliver electrons from the second electrode 180 to the emission layer 175. The electron transfer layer 177 may prevent holes injected from the first electrode 160 from moving to the second electrode 180 through the emission layer 175. For example, the electron transfer layer 177 may function as a hole blocking layer, and may help holes and electrons bond in the emission layer 175.

The electron transfer layer 177 may include an organic material. For example, the electron transfer layer 177 may be made of any one or more of Alq3 (tris(8-hydroxyquinolino) aluminum), PBD, TAZ, spiro-PBD, BAlq and SAlq.

The second electrode 180 may be disposed on the electron transfer layer 177.

The second electrode 180 may be a cathode, and may include a material with a low work function for easy electron injection. For example, a metal such as magnesium, calcium, sodium, potassium, titanium, indium, yttrium, lithium, gadolinium, aluminum, silver, tin, lead, cesium, barium, or an alloy thereof may be used, and multi-layered structure materials such as LiF/Al, LiO$_2$/Al, LiF/Ca, LiF/Al and BaF$_2$/Ca may be used.

The second electrode 180 may be made of an alloy, and the alloy ratio may be controlled and properly selected in accordance with the temperature, atmosphere, and vacuum degree of the deposition source.

The second electrode 180 may be composed of two or more layers.

Figure 3:
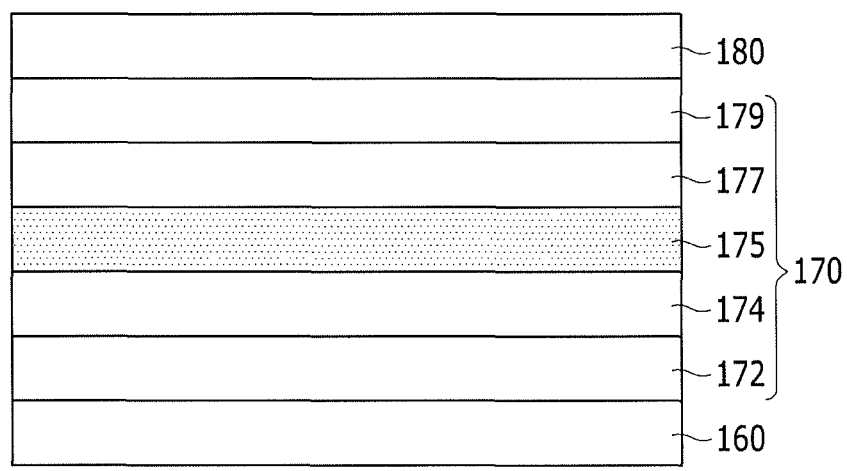
FIG. 3 illustrates a cross-sectional view of an exemplary embodiment with the organic light emitting diode of FIG. 2 partially modified.

FIG. 3 illustrates a cross-sectional view of an exemplary embodiment with the organic light emitting diode of FIG. 2 partially modified.

Referring to FIG. 3, a structure with an electron injection layer 179 in the organic light emitting diode LD according to the exemplary embodiment of FIG. 2 is illustrated. In the present exemplary embodiment, the electron injection layer 179 may be disposed between the electron transfer layer 177 and the second electrode 180. The electron injection layer 179 enables electrons to be easily injected to the electron transfer layer 177 from the second electrode 180. In the present exemplary embodiment, the electron injection layer 179 may include a metal with a low work function. The work function of metal for the electron injection layer 179 may be about 3.0 eV or less. For example, the electron injection layer 179 may include one or more of an alkali metal, an alkali earth metal, a rare earth element, an alkali metal oxide, an alkali earth metal oxide, a rare-earth oxide, or an alloy thereof. The electron injection layer 179 may include one or more of Li, Na, K, Rb, Cs, Ca, Sr, Ba, Ce, Sm, Eu, Gd, Yb, or an alloy thereof.

Other than the differences described above, those described in relation to FIG. 2 may be applied to the exemplary embodiment of FIG. 3.

Figure 4:
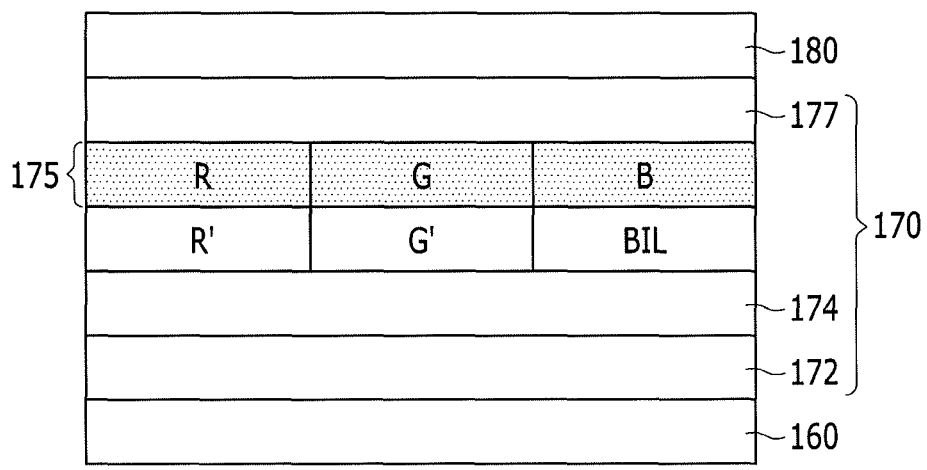
FIG. 4 illustrates a cross-sectional view of an exemplary embodiment with the organic light emitting diode of FIG. 2 partially modified.

FIG. 4 illustrates a cross-sectional view of an exemplary embodiment with the organic light emitting diode of FIG. 2 partially modified.

Referring to FIG. 4, the emission layer 175 of the organic light emitting diode LD described with reference to FIG. 2 was modified. For example, in the present exemplary embodiment, the emission layer 175 may include a red emission layer R, a green emission layer G, and a blue emission layer B, and an auxiliary-layer BIL for improving efficiency of the blue emission layer B may be disposed under the blue emission layer B.

The red emission layer R may be about 30 nm to about 50 nm thick, the green emission layer G may be about 10 nm to about 30 nm thick, and the blue emission layer B may be about 10 nm to about 30 nm thick. The auxiliary layer BIL under the blue emission layer B may be about 20 nm or less thick. The auxiliary layer BIL may adjust hole charge balance, and improve the efficiency of the blue emission layer B. The auxiliary layer BIL may include a compound expressed by the following Chemical formula 1.

Chemical formula 1

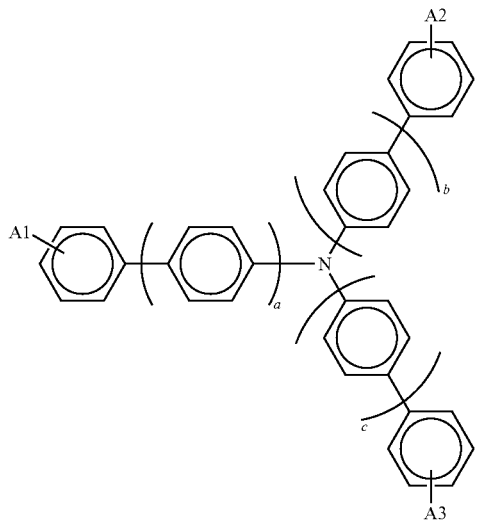

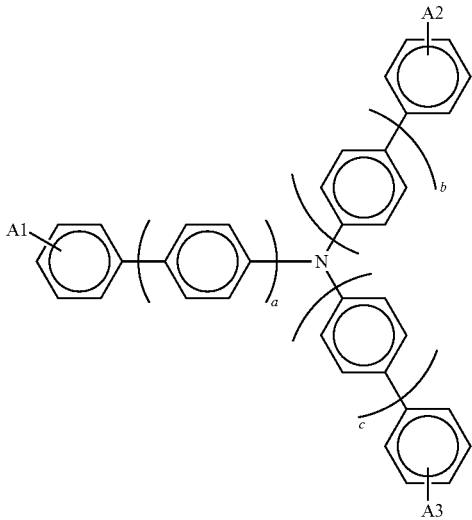

In Chemical formula 1, A1, A2, and A3 may each be an alkyl group, an aryl group, carbazole, dibenzothiophene, Dibenzofuran (DBF), and biphenyl, and a, b, and c may each be positive numbers between zero to four.

An example of compounds expressed by Chemical formula 1 may include the following Chemical formulae 1-1, 1-2, 1-3, 1-4, 1-5, and 1-6.

Chemical formula 1-1
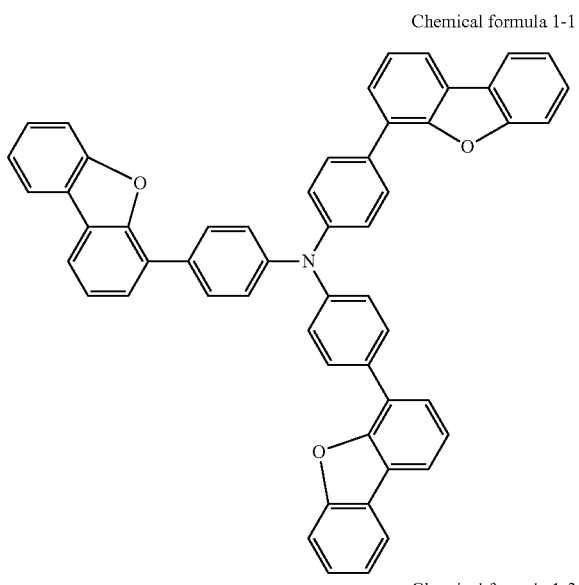
Chemical formula 1-2
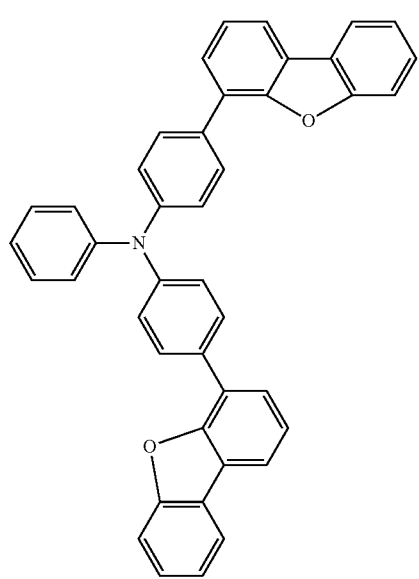
Chemical formula 1-3
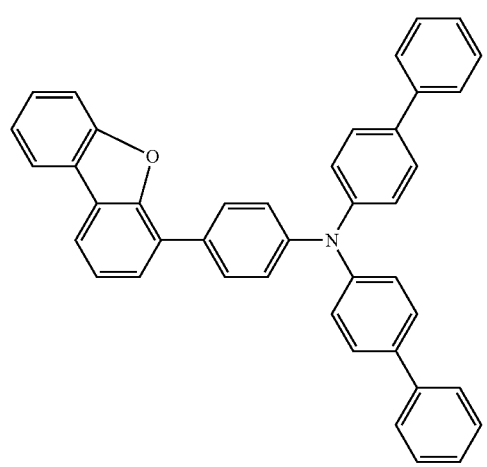
Chemical formula 1-4
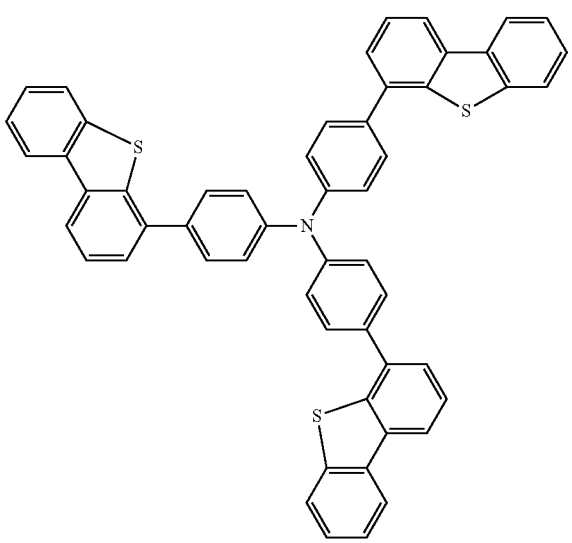
Chemical formula 1-5
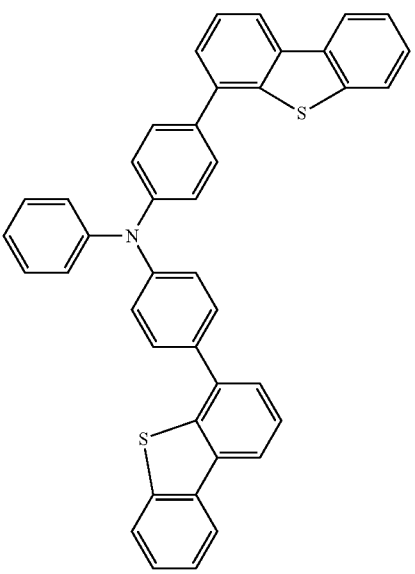
Chemical formula 1-6
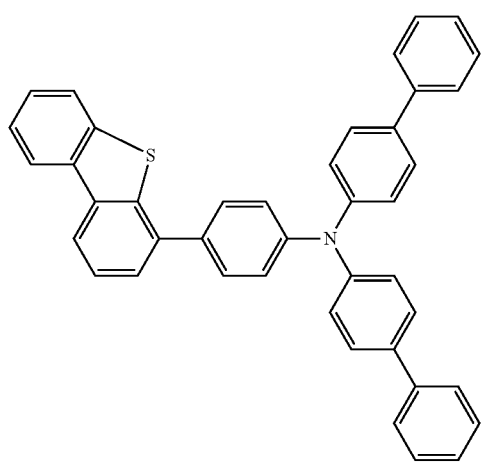

As another exemplary embodiment, the auxiliary layer BIL may include a compound expressed by the following Chemical formula 2.

Chemical formula 2

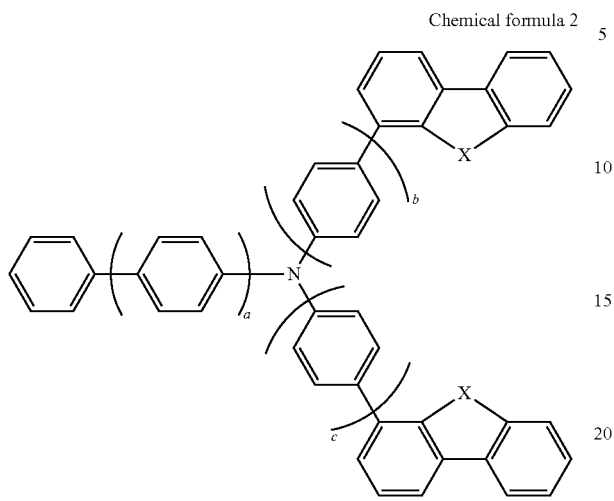

In Chemical formula 2, a is 0 to 3, b and c are each 0 to 3, X may be selected from O, N, and S, and each X may be the same or different.

An example of the compound expressed by Chemical formula 2 may include the following Chemical formulae 2-1 to 2-6.

Chemical formula 2-1

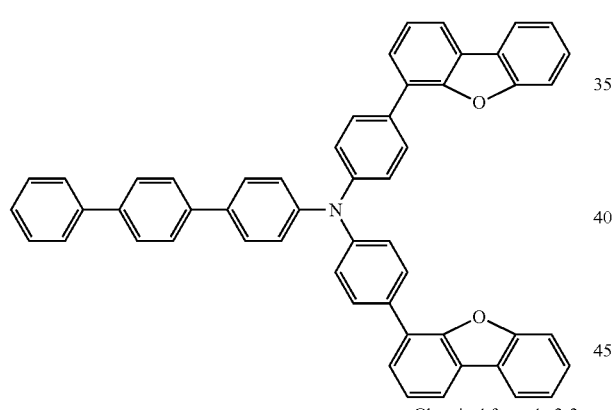

Chemical formula 2-2

Chemical formula 2-3

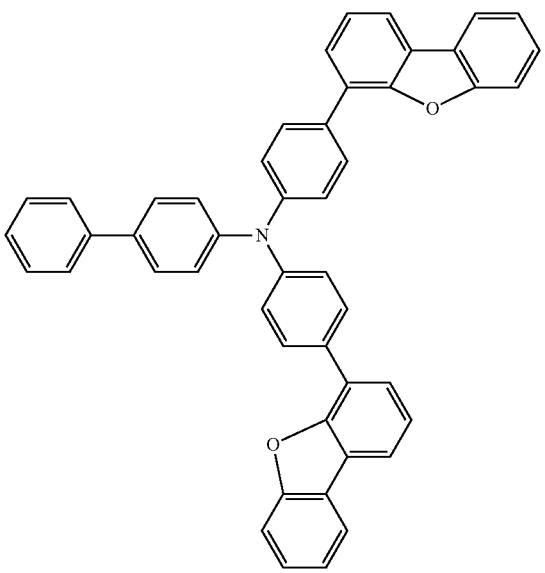

Chemical formula 2-4

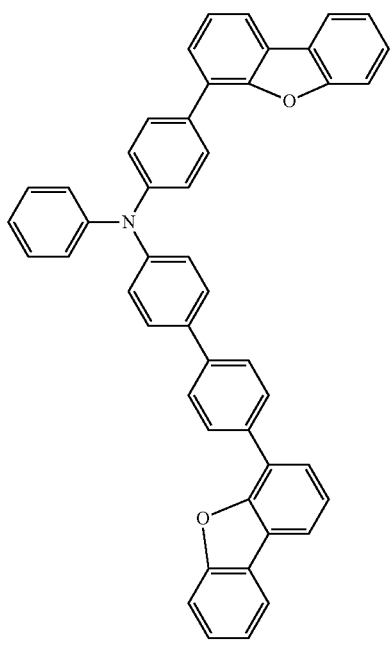

Chemical formula 2-5

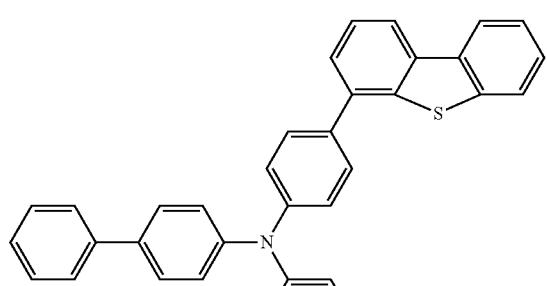

Chemical formula 2-6

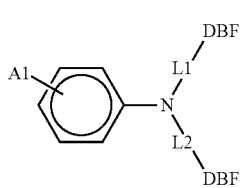

As another exemplary embodiment, the auxiliary layer BIL may include a compound expressed by the following Chemical formula 3.

Chemical formula 3

A1—〈ring〉—N(L1-DBF)(L2-DBF)

In Chemical formula 3, A1 may be an alkyl group, an aryl group, carbazole, dibenzothiophene, and Dibenzofuran (DBF), L1 and L2 may be

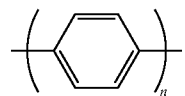

(n is 0 to 3), and DBF connected to L1 and L2 may be replaced by carbazole or dibenzothiophene.

Hereinafter, a composition method of the auxiliary layer BIL according to an exemplary embodiment will be described. For example, the composition method of the following Chemical formula 1-1 is described.

Chemical formula 1-1

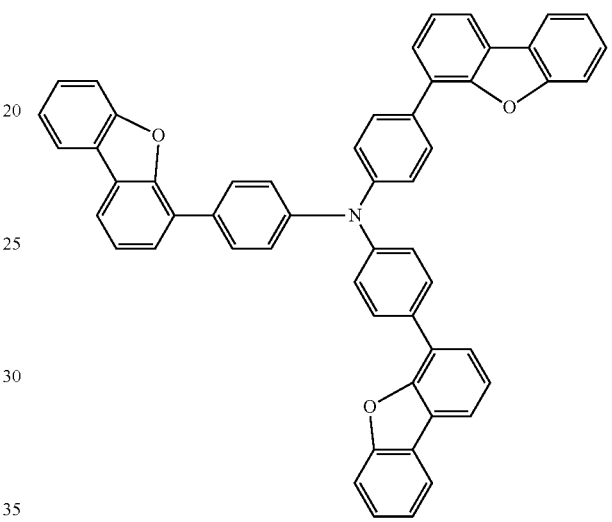

<Composition example>

Under argon atmosphere, 4-dibenzofuran boronic acid of 6.3 g, 4,4',4"-tribromotriphenylamine of 4.8 g, tetrakis(triphenylphosphine) palladium (Pd(PPh$_3$)$_4$) of 104 mg, sodium carbonate (Na$_2$CO$_3$) solution of 48 ml (2M), and toluene of 48 ml were put in a three-neck flask of 300 ml, and they react at 80° C. for eight hours. The reaction solution was extracted from toluene/water and the extract was dried with anhydrous sodium sulfate. It was concentrated under reduced pressure and a crude product obtained was refined through a column purifying process, whereby whitish yellow powder of 3.9 g was obtained.

Referring to FIG. 4, a red resonance auxiliary layer R' may be disposed below the red light emission layer R, and a green resonance auxiliary layer G' may be disposed below the green light emission layer G. The red resonance auxiliary layer R' and the green resonance auxiliary layer G' are layers that set a resonant distance (a resonance distance) for a respective one of the colors (e.g., red or green). In some embodiments, a blue resonance auxiliary layer is not included. For example, a separate resonance auxiliary layer disposed between the hole transport layer 174 and the blue light emission layer B and the auxiliary layer BIL may not be formed below the blue light emission layer B and the auxiliary layer BIL corresponding to the red light emission layer R or the green light emission layer G. In some embodiments, the auxiliary layer BIL physically contacts the hole transport layer 174.

Though not illustrated in FIG. 4, as in the exemplary embodiment described in relation to FIG. 3, the electron injection layer 179 may be formed between the second electrode 180 and the electron transfer layer 177.

Other than the differences described above, those described in relation to FIG. 2 may be applied to the exemplary embodiment of FIG. 4.

Figure 5:
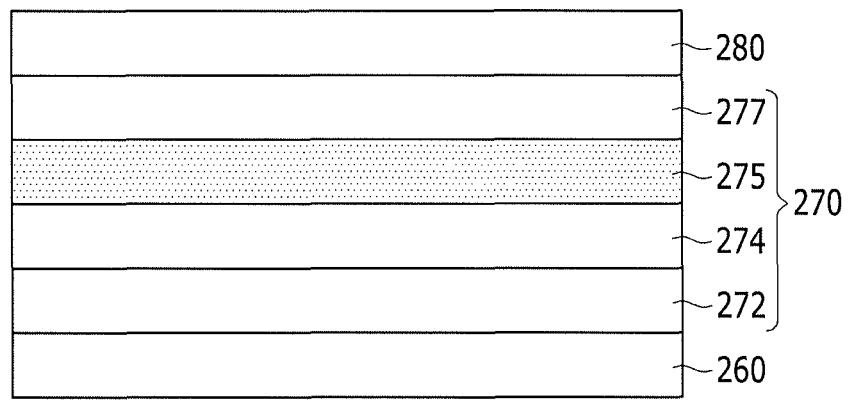
FIG. 5 illustrates a cross-sectional view of a modified exemplary embodiment of the organic light emitting diode of FIG. 2.

FIG. 5 illustrates a cross-sectional view of a modified exemplary embodiment of the organic light emitting diode of FIG. 2.

Referring to FIG. 5, an organic light emitting diode according to an exemplary embodiment may include a first electrode 260, a light emitting diode layer 270, and a second electrode 280. A hole injection layer 272 disposed on the first electrode 260 may include a metal having a work function of 4.3 eV or more (high work function). Using metal with a high work function allows reduction of a hole injection barrier against the first electrode 260 and a hole transfer layer 274. The hole injection layer 272 may further include a dipole material of a first component and a second component which have different polarities and/or an oxide having a relative dielectric constant of 10 or more. The hole injection layer 272 may be formed by co-depositing at least one or at least two or more of a metal having a work function of 4.3 eV or more (high work function), a dipole material of a first component and a second component, and an oxide having a relative dielectric constant of 10 or more.

In the present exemplary embodiment, when a dipole material and/or an oxide having a relative dielectric constant of 10 or more is added to the hole injection layer 272 including metal having a work function of 4.3 eV or more (high work function), polarization may occur on the interface, and tunneling may become easier with an increased electric field. For example, the dipole created on the interface may shift the vacuum level (and increase the LUMO level) of the hole transfer layer 274 or the emission layer 275 that is an organic material layer, and the injection barrier may be decreased.

Further, in the organic light emitting diode LD according to the present exemplary embodiment, the hole injection layer 272 including RbI may be disposed in the type of an amorphous thin film on the first electrode 260. When the first electrode 260 is made of ITO/Ag/ITO, Ag may be delivered to the organic material layer through crystalline ITO and may detract from the emission property.

The method having a work function of 4.3 eV or more (high work function) in the hole injection layer 272 may include one or more of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, or Zn.

The dipolar moment of the first component and the second component of the dipole material in the hole injection layer 272 may be 5 Debye or more. The first component may include one or more of an alkali metal, an alkali earth metal, a rare earth element, or a transition metal in the periodic table, and the second component may include a halogen. The first component may include one or more having a work function of 3.0 eV or less and selected from Li, Na, K, Rb, Cs, Ca, Sr, Ba, Ce, Sm, Eu, Gd, Yb, or an alloy thereof.

The oxide having a relative dielectric constant of 10 or more in the hole injection layer 272 may include one or more of $WO_3$, $MoO_3$, $Cu_2O$, $Yb_2O_3$, $Sm_2O_3$, $Nb_2O_3$, $Gd_2O_3$, or $Eu_2O_3$.

The hole transfer layer 274, the emission layer 275, the electron transfer layer 277, and the second electrode 280 over the hole injection layer 272 may follow those described in relation to FIG. 2.

Figure 6:
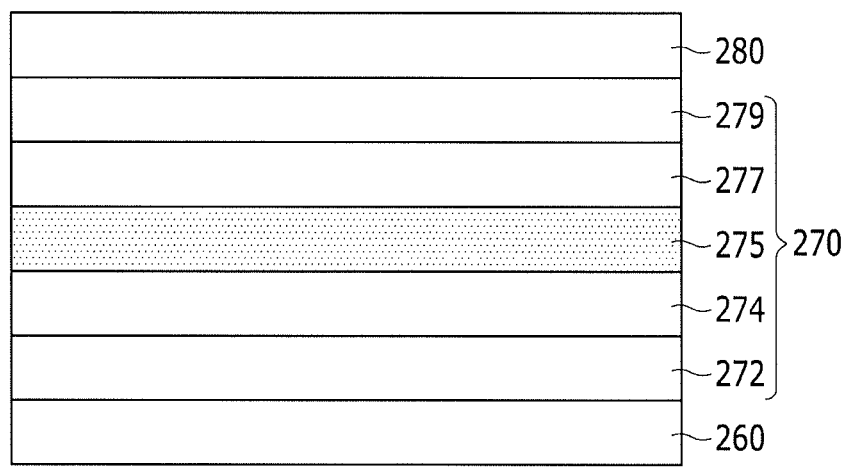
FIG. 6 illustrates a cross-sectional view of an exemplary embodiment with the organic light emitting diode of FIG. 5 partially modified.

FIG. 6 illustrates a cross-sectional view of an exemplary embodiment with the organic light emitting diode of FIG. 5 partially modified.

Referring to FIG. 6, a structure with an electron injection layer 279 in the organic light emitting diode LD according to the exemplary embodiment of FIG. 5 is illustrated. In the present exemplary embodiment, the electron injection layer 279 may be disposed between the electron transfer layer 277 and the second electrode 280. The electron injection layer 279 may enable electrons to be easily injected to the electron transfer layer 277 from the second electrode 280. In the present exemplary embodiment, the electron injection layer 279 may include a metal with a low work function. The work function of metal for the electron injection layer 279 may be 3.0 eV or less. For example, the electron injection layer 279 may be made one or more of an alkali metal, an alkali earth metal, a rare earth element, an alkali metal oxide, an alkali earth metal oxide, a rare-earth oxide, or an alloy thereof. The electron injection layer 279 may include one or more of Li, Na, K, Rb, Cs, Ca, Sr, Ba, Ce, Sm, Eu, Gd, Yb, or an alloy thereof.

Other than the differences described above, those described in relation to FIG. 5 may be applied to the exemplary embodiment of FIG. 6.

Figure 7:
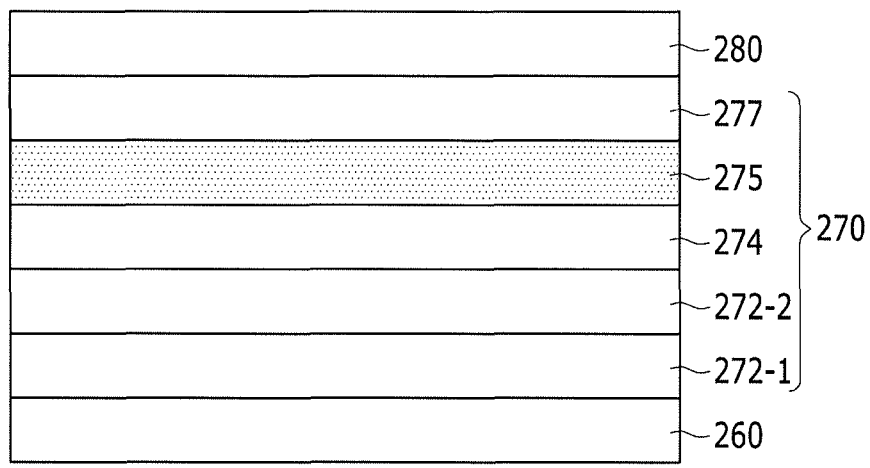
FIG. 7 illustrates a cross-sectional view of an exemplary embodiment with the organic light emitting diode of FIG. 5 partially modified.

FIG. 7 illustrates a cross-sectional view of an exemplary embodiment with the organic light emitting diode of FIG. 5 partially modified.

Referring to FIG. 7, a structure with a double-layered hole injection layer 272 in the organic light emitting diode LD according to the exemplary embodiment of FIG. 5 is illustrated. In the present exemplary embodiment, the hole injection layer 272 may include a first hole injection layer 272-1 and a second hole injection layer 272-2. The first hole injection layer 272-1 and the second hole injection layer 272-2 each may be formed by co-depositing at least one or at least two or more of a metal having a work function of 4.3 eV or more (high work function), a dipole material of a first component and a second component, and an oxide having a relative dielectric constant of 10 or more. The first hole injection layer 272-1 and the second hole injection layer 272-2 may be made of the same material or may include different materials.

Other than the differences described above, those described in relation to FIG. 5 may be applied to the exemplary embodiment of FIG. 7.

Figure 8:
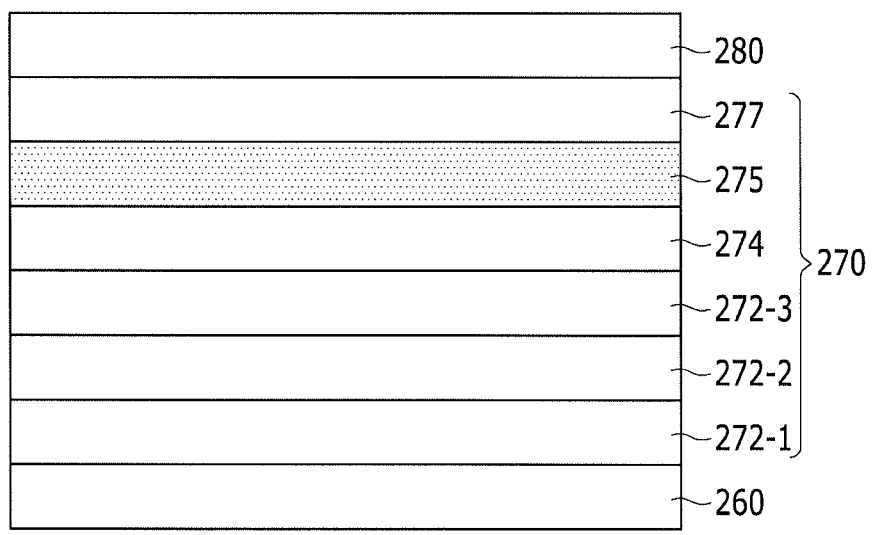
FIG. 8 illustrates a cross-sectional view of an exemplary embodiment with the organic light emitting diode of FIG. 5 partially modified.

FIG. 8 illustrates a cross-sectional view of an exemplary embodiment with the organic light emitting diode of FIG. 5 partially modified.

Referring to FIG. 8, a structure with a three-layered hole injection layer 272 in the organic light emitting diode LD according to the exemplary embodiment of FIG. 5 is illustrated. In the present exemplary embodiment, the hole injection layer 272 may include a first hole injection layer 272-1, a second hole injection layer 272-2, and a third hole injection layer 272-3. The first hole injection layer 272-1, the second hole injection layer 272-2, and the third hole injection layer 272-3 each may be formed by co-depositing at least one or at least two or more of a metal having a work function of 4.3 eV or more (high work function), a dipole material of a first component and a second component, and an oxide having a relative dielectric constant of 10 or more. The first hole injection layer 272-1, the second hole injection layer 272-2, and the third hole injection layer 272-3 may be made of the same material or may include different materials.

Other than the differences described above, those described in relation to FIG. 5 may be applied to the exemplary embodiment of FIG. 8.

Figure 9:
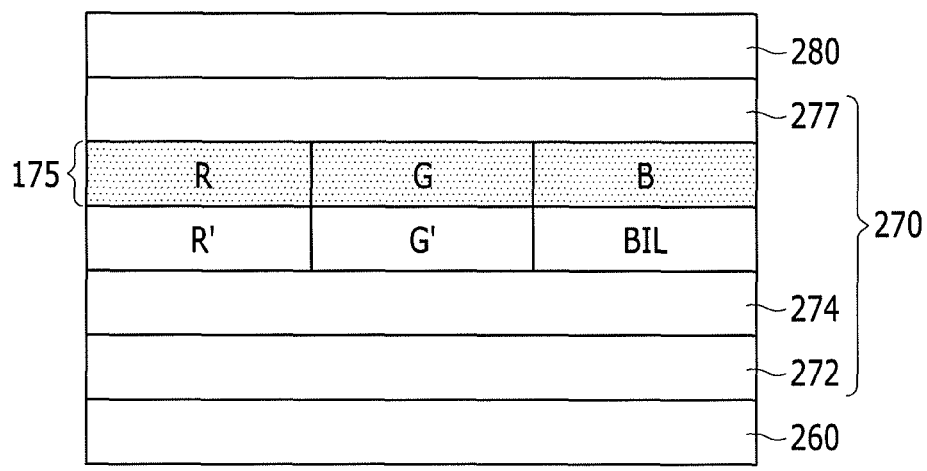
FIG. 9 illustrates a cross-sectional view of an exemplary embodiment with the organic light emitting diode of FIG. 5 partially modified.

FIG. 9 illustrates a cross-sectional view of an exemplary embodiment with the organic light emitting diode of FIG. 5 partially modified.

Referring to FIG. 9, the emission layer 275 of the organic light emitting diode LD described with reference to FIG. 5 was modified. For example, in the present exemplary embodiment, the emission layer 275 may include a red emission layer R, a green emission layer G, and a blue emission layer B, and an auxiliary layer BIL for improving efficiency of the blue emission layer B may be disposed under the blue emission layer B.

Description of the red emission layer R, green emission layer G, blue emission layer B, and sub-layer B-L under the blue emission layer B may refer to those described in relation to FIG. 4.

Referring to FIG. 9, a red resonance auxiliary layer R' may be disposed below the red light emission layer R, and a green resonance auxiliary layer G' may be disposed below the green light emission layer G. The red resonance auxiliary layer R' and the green resonance auxiliary layer G' are layers that set a resonant distance (a resonance distance) for a respective one of the colors (e.g., red or green). In some embodiments, a blue resonance auxiliary layer is not included. For example, a separate resonance auxiliary layer disposed between the hole transport layer 274 and the blue light emission layer B and the auxiliary layer BIL may not be formed below the blue light emission layer B and the auxiliary layer BIL corresponding to the red light emission layer R or the green light emission layer G. In some embodiments, the auxiliary layer BIL physically contacts the hole transport layer 274.

Though not illustrated in FIG. 9, as in the exemplary embodiment described in relation to FIG. 6, the electron injection layer 279 may be formed between the second electrode 280 and the electron transfer layer 277.

Other than the differences described above, those described in relation to FIG. 5 may be applied to the exemplary embodiment of FIG. 9.

By way of summation and review, an organic light emitting display device may have a large viewing angle, excellent contrast, and rapid response, as a self-light emitting type. An organic light emitting display device may include an organic light emitting diode, an electron injected from one electrode and a hole injected from another electrode may be combined in an emission layer, an exciton may be generated, the exciton may emit energy, and light may be emitted.

Provided are an organic light emitting diode that may have high efficiency and long lifespan and an organic light emitting display device including the organic light emitting diode. According to an exemplary embodiment, a hole injection layer including a dipole material may be formed, and emission efficiency may be increased. According to an exemplary embodiment, an auxiliary layer may be formed under a blue emission layer, and emission efficiency of the blue emission layer may be increased.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode, comprising:
a first electrode and a second electrode facing each other;
an emission layer between the first electrode and the second electrode; and
a hole injection layer between the first electrode and the emission layer, the hole injection layer including a dipole material including a first component and a second component that have different polarities,
wherein the emission layer includes a red emission layer, a green emission layer, and a blue emission layer, and further includes an auxiliary layer only under the blue emission layer such that the auxiliary layer is not included between the red emission layer and the hole injection layer and the auxiliary layer is not included between the green emission layer and the hole injection layer, and
wherein the auxiliary layer includes a compound expressed by the following Chemical Formula 1:

Chemical formula 1

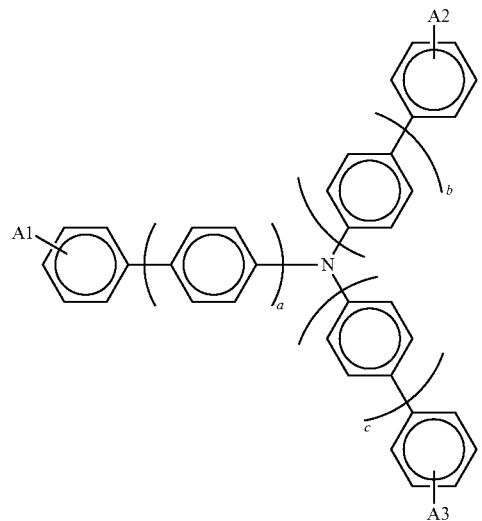

wherein, in Chemical Formula 1, A1, A2, and A3 are each hydrogen, a phenyl group, carbazole, dibenzothiophene, dibenzofuran (DBF), and biphenyl, and a, b, and c are each an integer of zero to four, and
wherein at least one of A1, A2, and A3 is

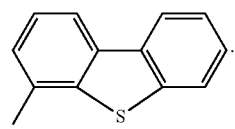

2. The organic light emitting diode as claimed in claim 1, wherein:
the first component is a metal or non-metal having a work function of 4.0 eV or more, and
the second component includes a halogen.

3. The organic light emitting diode as claimed in claim 2, wherein the first component includes one or more of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V W In, or Zn.

4. The organic light emitting diode as claimed in claim 3, wherein the second component includes one or more of F, Cl, Br, or I.

5. The organic light emitting diode as claimed in claim 4, wherein the dipole material includes one or more of $NiI_2$, $CoI_2$, $CuI$, $AgI$, $SnI_2$, or $InI_3$.

6. The organic light emitting diode as claimed in claim 2, further comprising:
   an electron injection layer between the emission layer and the second electrode,
   wherein the electron injection layer has a work function of 3.0 eV or less and includes one or more of an alkali metal, an alkali earth metal, a rare earth element, or a transition metal, or an alloy thereof.

7. The organic light emitting diode as claimed in claim 6, wherein the electron injection layer includes one or more of Li, Na, K, Rb, Cs, Ca, Sr, Ba, Ce, Sm, Eu, Gd, Yb, or an alloy thereof.

8. The organic light emitting diode as claimed in claim 1, wherein a dipole moment of the dipole material is 5 Debye or more.

9. The organic light emitting diode as claimed in claim 8, wherein:
   the first component includes one or more of an alkali metal, an alkali earth metal, a rare earth element, or a transition metal, and
   the second component includes a halogen.

10. The organic light emitting diode as claimed in claim 9, wherein the first component has a work function of 3.0 eV or less and includes one or more of Li, Na, K, Rb, Cs, Ca, Sr, Ba, Ce, Sm, Eu, Gd, Yb, or an alloy thereof.

11. The organic light emitting diode as claimed in claim 9, wherein the hole injection layer further includes a metal having a work function of 4.3 eV or more.

12. The organic light emitting diode as claimed in claim 11, wherein the metal having a work function of 4.3 eV or more includes one or more of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, or Zn.

13. The organic light emitting diode as claimed in claim 12, wherein the hole injection layer further includes an oxide having a relative dielectric constant of 10 or more.

14. The organic light emitting diode as claimed in claim 13, wherein the oxide includes one or more of $WO_3$, $MoO_3$, $Cu_2O$, $Yb_2O_3$, $Sm_2O_3$, $Nb_2O_3$, $Gd_2O_3$, or $Eu_2O_3$.

15. The organic light emitting diode as claimed in claim 8, further comprising:
   a hole transfer layer between the emission layer and the hole injection layer and an electron transfer layer between the emission layer and the second electrode,
   wherein the hole transfer layer and the electron transfer layer include an organic material.

16. The organic light emitting diode as claimed in claim 8, wherein the hole injection layer further includes at least one of metal having a work function of 4.3 eV or more and an oxide having a relative dielectric constant of 10 or more.

17. The organic light emitting diode as claimed in claim 16, wherein:
the hole injection layer is composed of a plurality of layers, and each of the plurality of layers includes at least one of the dipole material, the metal having a work function of 4.3 eV or more, and the oxide having a relative dielectric constant of 10 or more.

18. An organic light emitting display device, comprising:

a substrate;

a gate line on the substrate;

a data line and a driving voltage line;

a switching thin film transistor connected to the gate line and the data line;

a driving thin film transistor connected to the switching thin film transistor and the driving voltage line; and an organic light emitting diode connected to the driving thin film transistor, wherein the organic light emitting diode includes:

a first electrode and a second electrode facing each other;

an emission layer between the first electrode and the second electrode; and a hole injection layer between the first electrode and the emission layer, the hole injection layer including a dipole material of a first component and a second component that have different polarities, wherein the emission layer includes a red emission layer, a green emission layer, and a blue emission layer, and further includes an auxiliary layer only under the blue emission layer such that the auxiliary layer is not included between the red emission layer and the hole injection layer and the auxiliary layer is not included between the green emission layer and the hole injection layer, and wherein the auxiliary layer includes a compound expressed by the following Chemical Formula 1:

Chemical Formula 1

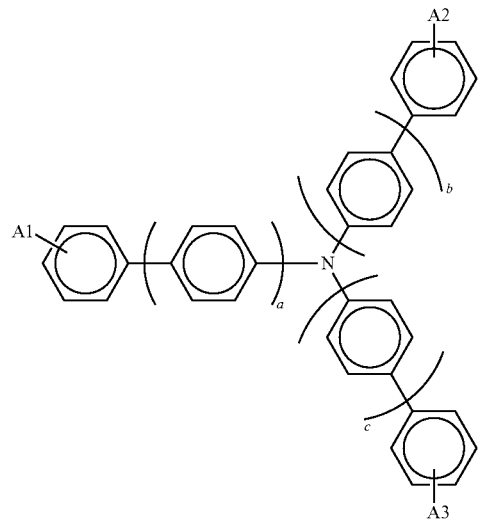

wherein, in Chemical Formula 1, A1, A2, and A3 are each hydrogen, a phenyl group, carbazole, dibenzothiophene, dibenzofuran (DBF), and biphenyl, and a, b, and c are each an integer of zero to four, and wherein at least one of A1, A2, and A3 is

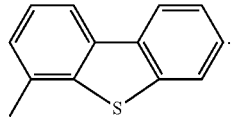

19. The organic light emitting display device as claimed in claim 18, wherein:
the first component is a metal or non-metal having a work function of 4.0 eV or more, and
the second component includes a halogen.

20. The organic light emitting display device as claimed in claim 19, wherein the first component includes one or more of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, In, or Zn.

21. The organic light emitting display device as claimed in claim 20, wherein the second component includes one or more of F, Cl, Br, or I.

22. The organic light emitting display device as claimed in claim 21, wherein the dipole material includes one or more of $NiI_2$, $CoI_2$, $CuI$, $AgI$, $SnI_2$ or $InI_3$.

23. The organic light emitting display device as claimed in claim 18, wherein a dipole moment of the dipole material is 5 Debye or more.

24. The organic light emitting display device as claimed in claim 23, wherein:
the first component includes one or more of an alkali metal, an alkali earth metal, a rare earth element, or a transition metal, and
the second component includes a halogen.

25. The organic light emitting display device as claimed in claim 24, wherein the first component has a work function of 3.0 eV or less and includes one or more of Li, Na, K, Rb, Cs, Ca, Sr, Ba, Ce, Sm, Eu, Gd, Yb, or an alloy thereof.

26. The organic light emitting display device as claimed in claim 24, wherein the hole injection layer further includes a metal having a work function of 4.3 eV or more.

27. The organic light emitting display device as claimed in claim 26, wherein the metal having a work function of 4.3 eV or more includes one or more of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, or Zn.

28. The organic light emitting display device as claimed in claim 26, wherein the hole injection layer further includes an oxide having a relative dielectric constant of 10 or more.

29. The organic light emitting display device as claimed in claim 28, wherein the oxide includes one or more of $WO_3$, $MoO_3$, $Cu_2O$, $Yb_2O_3$, $Sm_2O_3$, $Nb_2O_3$, $Gd_2O_3$, or $EU_2O_3$.

30. The organic light emitting display device as claimed in claim 18, further comprising a red resonance auxiliary layer disposed below the red light emission layer and a green resonance auxiliary layer disposed below the green light emission layer.

31. The organic light emitting display device as claimed in claim 18, wherein the auxiliary layer further includes a compound expressed by the following Chemical formula 2:

Chemical formula 2

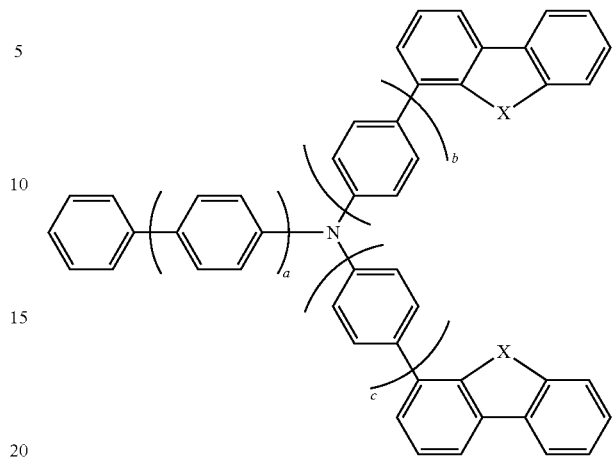

wherein a is 0 to 3, b and c are each 0 to 3, X is selected from O, N, and S, and each X is the same or different.

32. The organic light emitting diode as claimed in claim 1, wherein the compound expressed by Chemical formula 1 is a compound of one of the following Chemical formulae 1-4 to 1-6:

Chemical formula 1-4

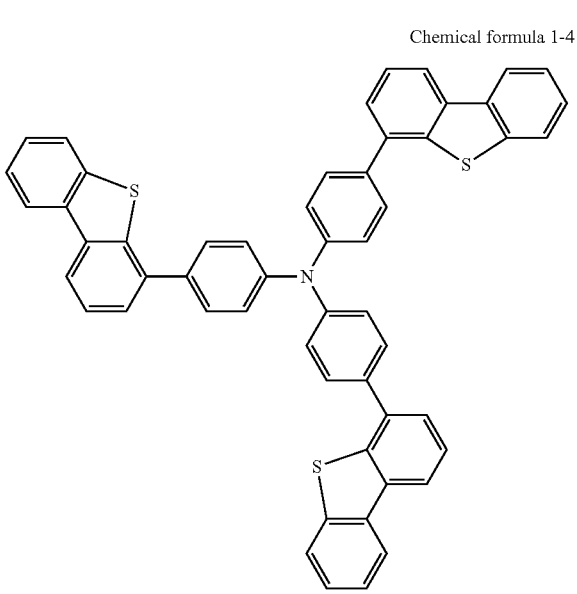

-continued
Chemical formula 1-5
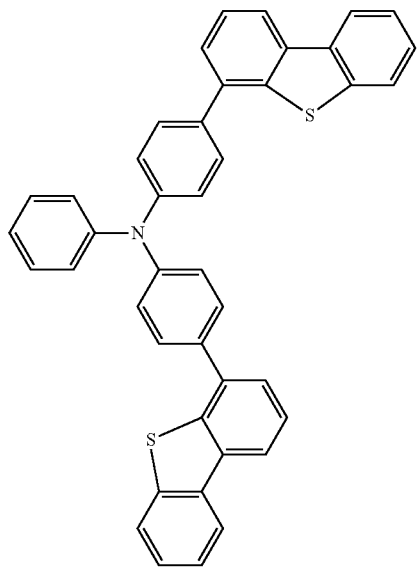
Chemical formula 1-4
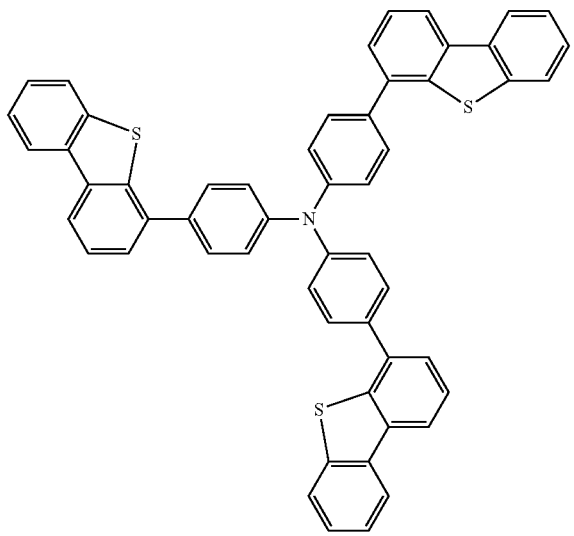
Chemical formula 1-6
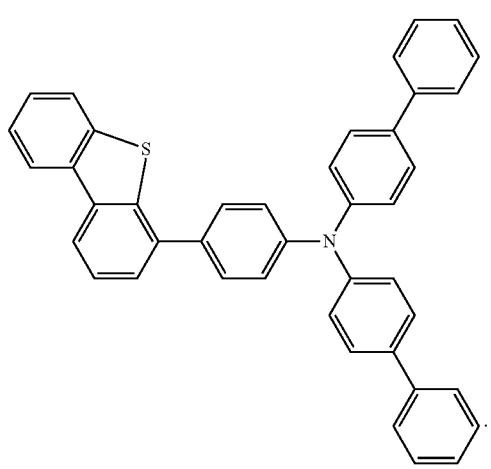
Chemical formula 1-5
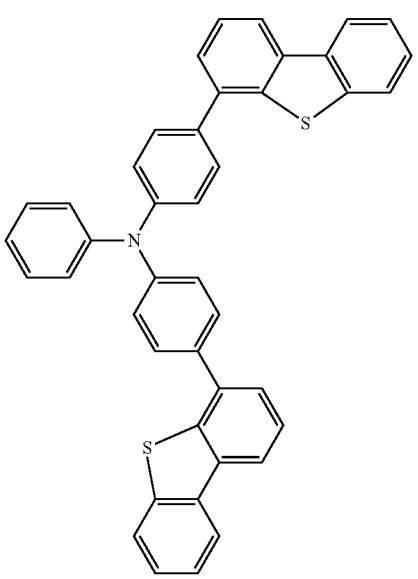
Chemical formula 1-6
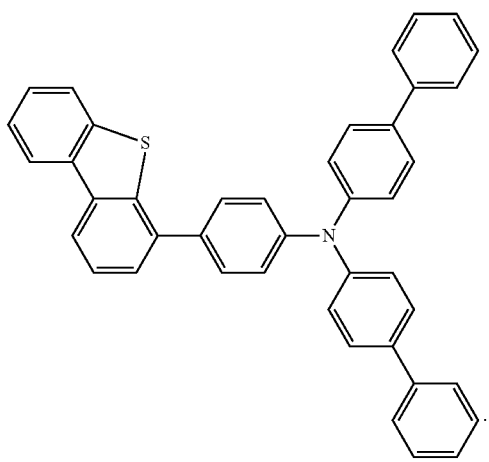
33. The organic light emitting display device as claimed in claim 18, wherein the compound expressed by Chemical formula 1 is a compound of one of the following Chemical formulae 1-4 to 1-6:
* * * * *